(12) United States Patent
Kulkarni

(10) Patent No.: US 8,788,756 B2
(45) Date of Patent: Jul. 22, 2014

(54) CIRCUIT FOR AND METHOD OF ENABLING THE TRANSFER OF DATA BY AN INTEGRATED CIRCUIT

(75) Inventor: Sanjay A. Kulkarni, Maharashtra (IN)

(73) Assignee: Xilinx, Inc., San Jose, CA (US)

( * ) Notice: Subject to any disclaimer, the term of this patent is extended or adjusted under 35 U.S.C. 154(b) by 284 days.

(21) Appl. No.: 13/305,687

(22) Filed: Nov. 28, 2011

(65) Prior Publication Data

US 2013/0138879 A1  May 30, 2013

(51) Int. Cl.
*G06F 12/00* (2006.01)
*G06F 13/42* (2006.01)
*G11C 7/10* (2006.01)

(52) U.S. Cl.
CPC *G06F 13/42* (2013.01); *G11C 7/10* (2013.01); *G06F 13/4291* (2013.01)
USPC .......... 711/114; 711/167; 711/E12.041

(58) Field of Classification Search
CPC ........ G06F 13/42; G06F 13/4291; G11C 7/10
USPC ........... 711/103, 167, 112, 114, E12.041; 710/316
See application file for complete search history.

(56) References Cited

U.S. PATENT DOCUMENTS

| 5,333,293 | A  | * | 7/1994  | Bonella .................... | 711/167    |
|-----------|----|---|---------|------------------------------|------------|
| 5,526,497 | A  | * | 6/1996  | Zilka et al. ................ | 710/316    |
| 5,883,945 | A  | * | 3/1999  | Richardson et al. ......... | 379/189    |
| 6,170,036 | B1 | * | 1/2001  | Konishi et al. ............. | 711/104    |
| 6,347,063 | B1 | * | 2/2002  | Dosaka et al. ............ | 365/189.17 |
| 2008/0005434 | A1 |   | 1/2008  | Lee et al.                   |            |
| 2012/0287729 | A1 | * | 11/2012 | Hirobe ....................  | 365/189.05 |
| 2013/0083611 | A1 | * | 4/2013  | Ware et al. ................ | 365/191    |

OTHER PUBLICATIONS

Xilinx, Inc., "Configuring Xilinx FPGAs with SPI Serial Flash", XAPP951 (v.1.3), Stephanie Tapp, Application Note: Spartan-3E and Virtex-5 FPGAs, Sep. 23, 2010, pp. 1-26, Xilinx, Inc. 2100 Logic Drive, CA USA.
Xilinx, Inc., "Indirect Programming of SPI Serial Flash PROMs with Spartan-3A FPGAs", XAPP974 (v1.1.3) Jameel Hussein, Application Note: Spartan-3A FPGAs, Mar. 24, 2009, pp. 1-18, Xilinx, Inc. 2100 Logic Drive, CA USA.
Spansion, "256-Mbit CMOS 3.0 Volt Flash Memory with 104-MHz SPI (Serial Peripheral Interface) Multi I/O Bus", Publicaton No. S70FL256P Data Sheet, Rev. 4, Jun. 24, 2011, pp. 1-19.
Micron Technologies Inc., "Micron Serial NOR Flash Memory", 256 Mb, Multiple I/O Serial Flash Memory Features, Rev. G., Jul. 2011, pp. 1-87.
Micron Technologies Inc., Numonyx, N25Q256, 256-Mbit 3V, multiple I/O, 4-Kbyte subsector erase, XiP enbled, serial flash memory with 108 MHz SPI bus interface, Nov. 2010, Rev. 3, 1-186.
Winbond, W25Q64BV, spiflash, "64M-Bit Serial Flash Memory with Dual and Quad SPI", Mar. 13, 2009, pp. 1-58.

* cited by examiner

*Primary Examiner* — Pierre-Michel Bataille
(74) *Attorney, Agent, or Firm* — John J. King

(57) ABSTRACT

A circuit for enabling the transfer of data by an integrated circuit device is described. The circuit comprises a non-volatile memory array coupled to receive a clock signal and having a plurality of memory elements storing data; and a control circuit coupled to the non-volatile memory array, the control circuit enabling uni-directional transfer of data on a plurality of signal lines between the non-volatile memory array and the control circuit in a first mode and bi-directional transfer of data in a second mode; wherein the control circuit controls the transfer of data on the plurality of signal lines between the non-volatile memory array and the control circuit in the first mode on both the rising and falling edges of the clock signal. A method of enabling the transfer of data by an integrated circuit device is also described.

19 Claims, 9 Drawing Sheets

CIRCUIT FOR AND METHOD OF ENABLING THE TRANSFER OF DATA BY AN INTEGRATED CIRCUIT

FIELD OF THE INVENTION

An embodiment relates generally to integrated circuit devices and in particular to a circuit for and method of enabling the transfer of data by an integrated circuit.

BACKGROUND

It is often necessary, in implementing integrated circuit devices, to transmit data between integrated circuit devices or between elements of a given integrated circuit device. Because the integrated circuit device may not be able to perform necessary functions without the data, the transmission of data can affect the performance of the integrated circuit. Further, the speed of the data transfer may affect the speed of operation of the integrated circuit device. Any delay in the data transfer may impact the ability for the integrated circuit to implement various functions.

Many data transfer protocols exist for transferring data between a peripheral device, such as a non-volatile memory, and an integrated circuit which can be a master device or a controller. A Serial Peripheral Interface (SPI) is a conventional protocol used in serial memory interfaces. The SPI protocol is used in serial Flash memory; static random access memory (SRAM) and serial electrically erasable programmable read only memory (EEPROM) interfaces, for example. The SPI protocol is based upon a four wire interface, between master and slave devices. The four signal lines include a Chip Select line, an SPI Clock line, a Master-In Slave-Out (MISO) line, and a Master-Out Slave-In (MOSI) line. The MOSI and MISO lines are unidirectional lines controlled by master and slave SPI devices, respectively. The SPI protocol is a full-duplex protocol where the master and slave SPI devices exchange data on MISO and MOSI pins with respect to a rising or falling edge of an SPI clock edge which is generated by the master SPI controller. However, the SPI protocol has many deficiencies.

SUMMARY OF THE INVENTION

According to an embodiment, a circuit for enabling the transfer of data by an integrated circuit device is described. The circuit comprises a non-volatile memory array coupled to receive a clock signal and having a plurality of memory elements storing data; and a control circuit coupled to the non-volatile memory array, the control circuit enabling uni-directional transfer of data on a plurality of signal lines between the non-volatile memory array and the control circuit in a first mode and bi-directional transfer of data on the plurality of signal lines between the non-volatile memory array and the control circuit in a second mode; wherein the control circuit controls the transfer of data on the plurality of signal lines between the non-volatile memory array and the control circuit in the first mode on both the rising and falling edges of the clock signal.

The circuit may further comprise a status register storing an indication of the transfer of data in one of the first mode and the second mode, wherein the indication of the transfer of data in one of the first mode and the second mode is generated by the control circuit. A first signal line of the plurality of signal lines may be adapted to transmit data from the control circuit to the non-volatile memory array and a second signal line of the plurality of signal lines may be adapted to transmit data from the non-volatile memory array to the control circuit in the second mode. Further, a first signal line of the plurality of signal lines may be adapted to transmit data from the non-volatile memory array to the control circuit and a second signal line of the plurality of signal lines may be adapted to transmit data from the non-volatile memory array to the control circuit in the first mode. The circuit may further comprise a buffer which may be configured to transfer data on both the rising and falling edges in the first mode and to transfer data on one of the rising or falling edges of the clock signal in the second mode. The circuit may also comprise a first buffer enabling the transfer of data from the non-volatile memory array to the configuration memory elements on a first signal line of the plurality of signal lines in a standard mode, and a second buffer enabling the transfer of data from the non-volatile memory array to the configuration memory elements on the first signal line and a second signal line of the plurality of signal lines in a high data rate mode.

According to an alternate embodiment, a circuit for enabling the transfer of data by an integrated circuit device comprises a non-volatile memory array coupled to receive a clock signal and having a plurality of memory elements storing data; a control circuit coupled to the non-volatile memory array, the control circuit enabling uni-directional transfer of data on a plurality of signal lines between the non-volatile memory array and the control circuit in a first mode and bi-directional transfer of data on the plurality of signal lines between the non-volatile memory array and the control circuit in a second mode; a first buffer coupled to the non-volatile memory array, the first buffer receiving data transferred in the first mode; and a second buffer coupled to the non-volatile memory array, the second buffer receiving data transferred in the second mode; wherein the control circuit controls the transfer of data in the second mode on both the rising and falling edges of the clock signal.

According to the alternate embodiment, the circuit may further comprise a status register storing an indication of a transfer of data on one of the rising or falling edges of the clock signal or both of the rising and falling edges of the clock signal, where the status register may also a memory busy indication bit. A first signal line of the plurality of signal lines may be adapted to transmit data to the non-volatile memory array and a second signal line of the plurality of signal lines may be adapted to transmit data from the non-volatile memory array in the second mode. The first signal line of the plurality of signal lines may be adapted to transmit data to the non-volatile memory array and the second signal line of the plurality of signal lines may be adapted to transmit data to the non-volatile memory array in the first mode. The circuit may further comprise a third data line and a fourth data line, wherein data is transferred to the non-volatile memory array on each of the first through fourth data lines in a third mode.

A method of enabling the transfer of data by an integrated circuit device is also described. The method comprises enabling the bi-directional communication of data between a non-volatile memory array and a circuit of the integrated circuit using a plurality of signal lines; receiving a command to transfer data at a high data rate with the non-volatile memory array; receiving a clock signal for transferring the data with the non-volatile memory array; and transferring the data on the plurality of signal lines between the non-volatile memory array and the circuit using both a rising edge and a falling edge of the clock signal.

The method may further comprise setting a status register indicating that data is being transmitted at the high data rate. The method may also comprise receiving a Chip Select signal to transfer a page of data. The method may further comprise storing a busy indication in a status register until the page of data is transferred between a buffer and the non-volatile memory array, and waiting for the busy indication to be reset if the Chip Select signal remains asserted. The method may further comprise enabling dual edge operation of a buffer coupled to the non-volatile memory array during the high data rate transfer of data with the non-volatile memory array. The method may also comprise adjusting the clock speed when transferring the data with the non-volatile memory array during the high data rate transfer of data with the non-volatile memory array.

DETAILED DESCRIPTION OF THE DRAWINGS

Figure 1:
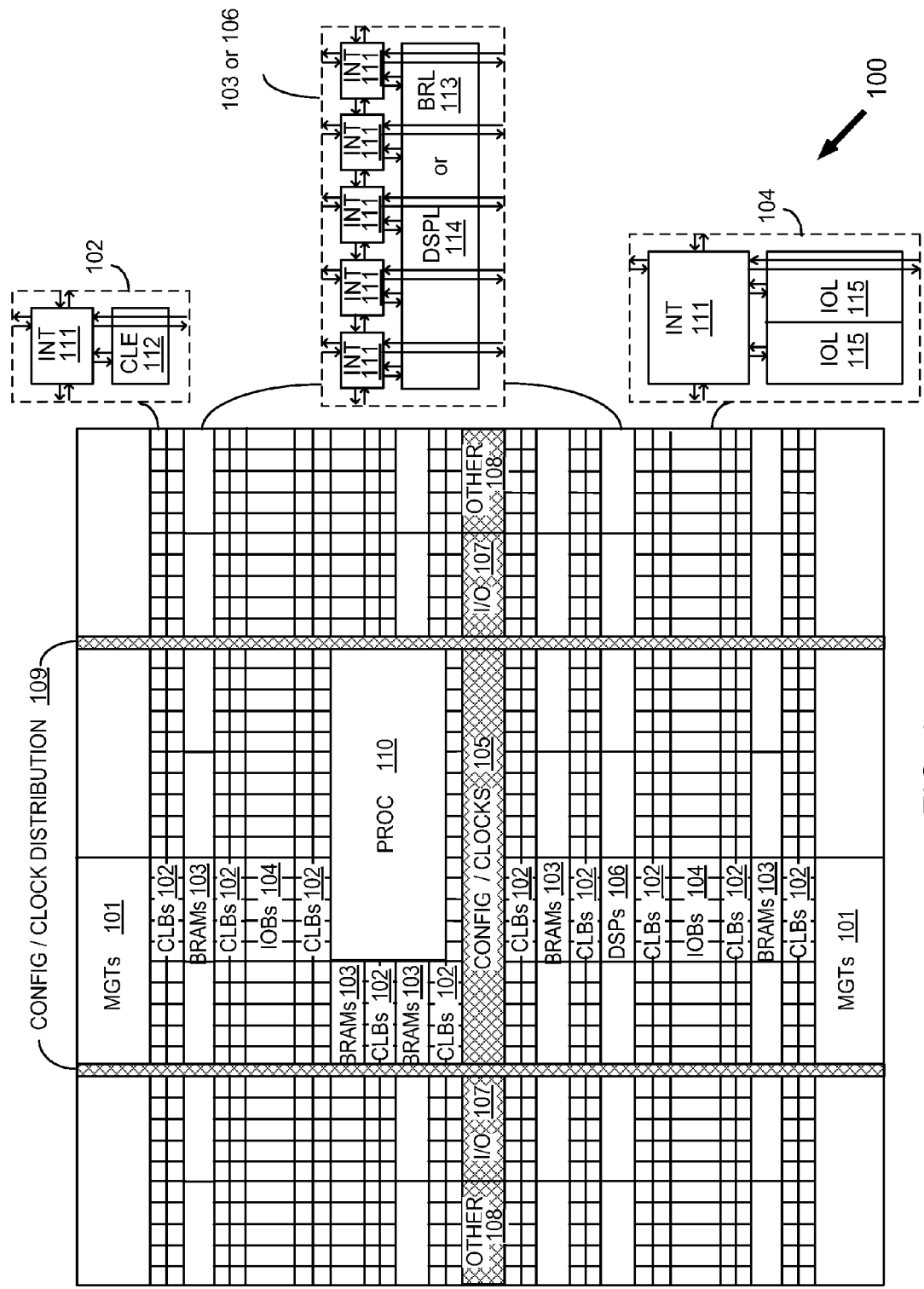
FIG. 1 is a block diagram of a programmable integrated circuit device having programmable resources according to an embodiment.

Turning first to FIG. 1, a block diagram of a programmable integrated circuit device having programmable resources according to an embodiment is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 1 comprises an FPGA architecture 100 having a large number of different programmable tiles including multi-gigabit transceivers (MGTs) 101, CLBs 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., configuration ports and clock ports), and other programmable logic 108 such as digital clock managers, analog-to-digital converters, system monitoring logic, and so forth. Some FPGAs also include dedicated processor blocks (PROC) 110, which may be used to implement a software application, for example.

In some FPGAs, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 may include a configurable logic element (CLE) 112 that may be programmed to implement user logic plus a single programmable interconnect element 111. A BRAM 103 may include a BRAM logic element (BRL) 113 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 106 may include a DSP logic element (DSPL) 114 in addition to an appropriate number of programmable interconnect elements. An IOB 104 may include, for example, two instances of an input/output logic element (IOL) 115 in addition to one instance of the programmable interconnect element 111. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. Horizontal areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks may be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear in order to facilitate the efficient implementation of user logic. While the embodiment of FIG. 1 relates to an integrated circuit having programmable resources, it should be understood that the circuits and methods set forth in more detail below could be implemented in any type of ASIC.

One common implementation of a data transfer is the transfer of configuration data from a non-volatile memory to memory elements of the integrated circuit device, such as to configuration memory elements of a device having programmable resources. While the configuration data is typically provided to various circuits of the integrated circuit device during a start-up operation other configuration, data may be provided to the integrated circuit during a partial reconfiguration of the device. That is, rather than providing all of the configuration data to the integrated circuit device, new configuration data comprising a portion of the configuration data may be provided to the integrated circuit device to reprogram some of the circuits of the integrated circuit device. As programmable integrated circuits are implemented with more programmable circuits, the amount of time required to transfer the data to the programmable circuits is also increasing. Accordingly, any improvement in the rate of transfer of the configuration data is beneficial.

Figure 2:
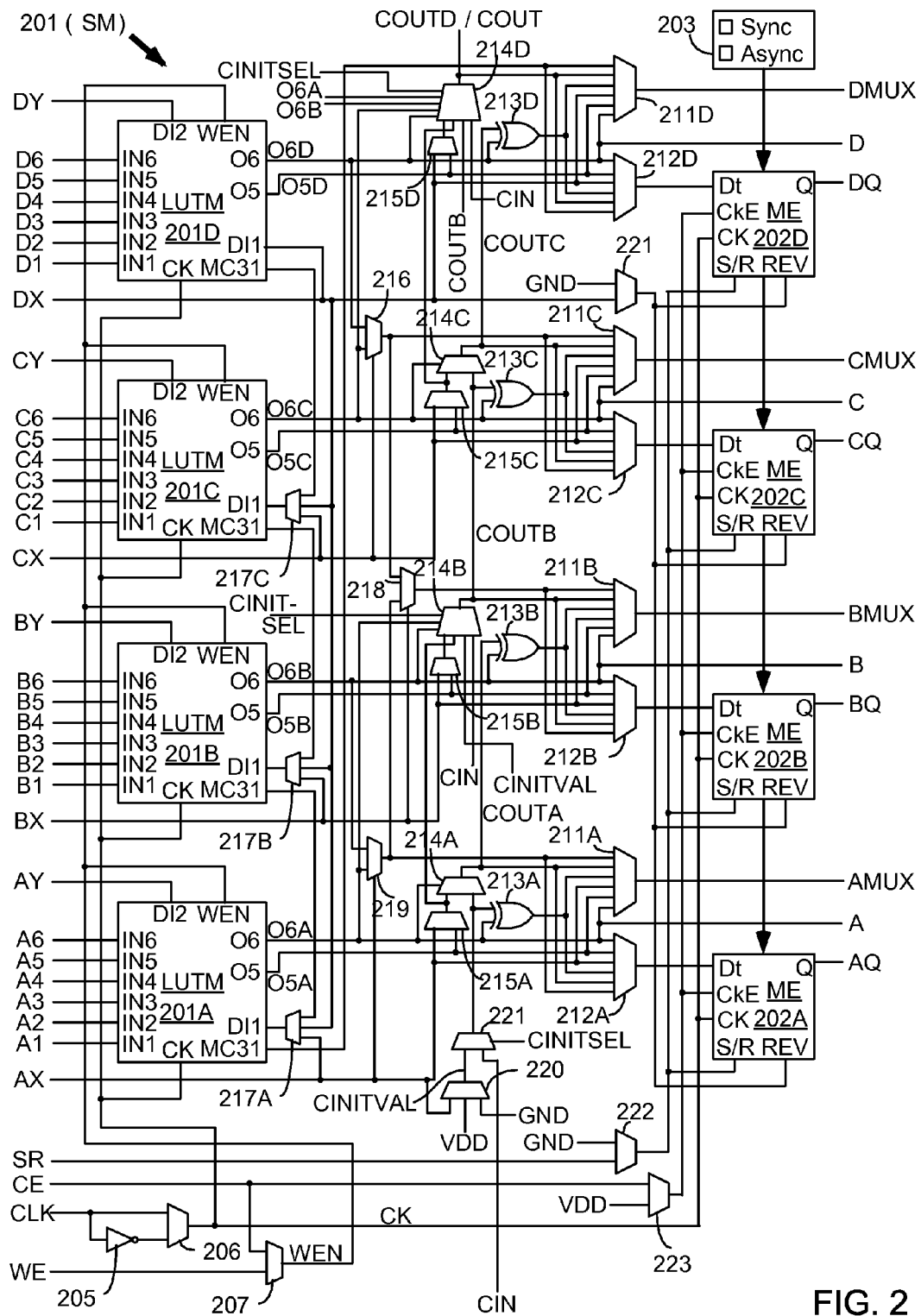
FIG. 2 is a block diagram of a configurable logic element according to an embodiment.

Turning now to FIG. 2, a block diagram of a configurable logic element according to an embodiment is shown. In particular, FIG. 2 illustrates in simplified form a configurable logic element of a configuration logic block 102 of FIG. 1. In the embodiment of FIG. 2, slice M 201 includes four lookup tables (LUTMs) 201A-201D, each driven by six LUT data input terminals A1-A6, B1-B6, C1-C6, and D1-D6 and each providing two LUT output signals O5 and O6. The O6 output terminals from LUTs 201A-201D drive slice output terminals A-D, respectively. The LUT data input signals are supplied by the FPGA interconnect structure via input multiplexers, which may be implemented by programmable interconnect element 211, and the LUT output signals are also supplied to the interconnect structure. Slice M also includes: output select multiplexers 211A-211D driving output terminals AMUX-DMUX; multiplexers 212A-212D driving the data input terminals of memory elements 202A-202D; combinational multiplexers 216, 218, and 219; bounce multiplexer circuits 222-223; a circuit represented by inverter 205 and multiplexer 206 (which together provide an optional inversion on the input clock path); and carry logic having multiplexers 214A-214D, 215A-215D, 220-221 and exclusive OR gates 213A-213D. All of these elements are coupled together as shown in FIG. 2. Where select inputs are not shown for the multiplexers illustrated in FIG. 2, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 2 for clarity, as well as from other selected figures herein.

In the pictured embodiment, each memory element 202A-202D may be programmed to function as a synchronous or asynchronous flip-flop or latch. The selection between synchronous and asynchronous functionality is made for all four memory elements in a slice by programming Sync/Asynch selection circuit 203. When a memory element is programmed so that the S/R (set/reset) input signal provides a set function, the REV input terminal provides the reset function. When the memory element is programmed so that the S/R input signal provides a reset function, the REV input terminal provides the set function. Memory elements 202A-202D are clocked by a clock signal CK, which may be provided by a global clock network or by the interconnect structure, for example. Such programmable memory elements are well known in the art of FPGA design. Each memory element 202A-202D provides a registered output signal AQ-DQ to the interconnect structure. Because each LUT 201A-201D provides two output signals, O5 and O6, the LUT may be configured to function as two 5-input LUTs with five shared input signals (IN1-IN5), or as one 6-input LUT having input signals IN1-IN6.

In the embodiment of FIG. 2, each LUTM 201A-201D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 217A-217C for LUTs 201A-201C), or to the two 32-bit RAMs via input terminals DI1 and DI2. RAM write operations in the LUT RAMs are controlled by clock signal CK from multiplexer 206 and by write enable signal WEN from multiplexer 207, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 201A may also be provided to the general interconnect structure for shift register chaining, via output select multiplexer 211D and CLE output terminal DMUX. Accordingly, the circuits and methods set forth below may be implemented in a device such as the devices of FIGS. 1 and 2, or any other suitable device.

Figure 3:
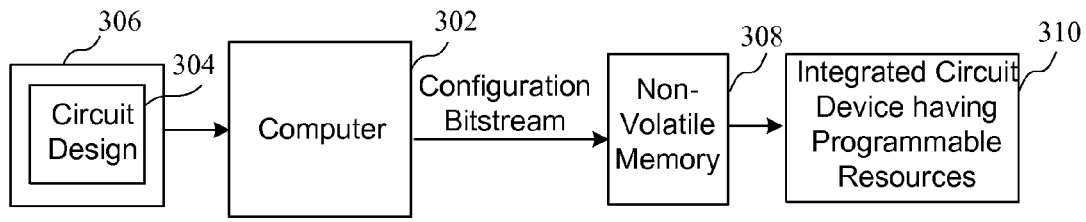
FIG. 3 is a block diagram of a system for programming a device having programmable resources according to an embodiment.

Turning now to FIG. 3, a block diagram of a system for programming a device having programmable resources according to an embodiment is shown. In particular, a computer 302 is coupled to receive a circuit design 304 from a memory 306, and generate a configuration bitstream which is stored in the non-volatile memory 308. The non-volatile memory 308 may be a Flash memory, for example. As will be described in more detail below, the circuit design may be a high level design, such as a circuit design defined in a hardware description language (HDL). Also, the computer may be configured to run software that generates a configuration bitstream which is stored in the non-volatile memory 308 and then provided to a device 310 having programmable resources. As will be described in more detail below, the device 310 may be any type of integrated circuit having programmable resources, such as a programmable logic device, or an application specific integrated circuit having programmable resources.

The software flow for a circuit design to be implemented in a programmable integrated circuit comprises synthesis, packing, placement and routing, as is well known in the art. Synthesis comprises the step of converting a circuit design in a high level design to a configuration of elements found in the programmable integrated circuit. For example, a synthesis tool operated by the computer 302 may implement the portions of a circuit design implementing certain functions in configurable logic blocks (CLBs) or digital signal processing (DSP) blocks, for example. An example of a synthesis tool is the ISE® tool available from Xilinx, Inc. of San Jose, Calif. Packing comprises the step of grouping portions of the circuit design into defined blocks of the device, such as CLBs. Placing comprises the step of determining the location of the blocks of the device defined during the packing step. Finally, routing comprises selecting paths of interconnect elements, such as programmable interconnects, in a programmable integrated circuit. At the end of place and route, all functions, positions and connections are known, and a configuration bitstream is then created. The bitstream may be created by a software module called BitGen available from Xilinx, Inc. of San Jose, Calif. The bitstream may also be encrypted according to a predetermined encryption standard. The bitstream is either downloaded by way of a cable or programmed into an EPROM for delivery to the programmable integrated circuit. If encoded, the bitstream is then decoded by the programmable integrated circuit according to the predetermined encryption standard.

Figure 4:
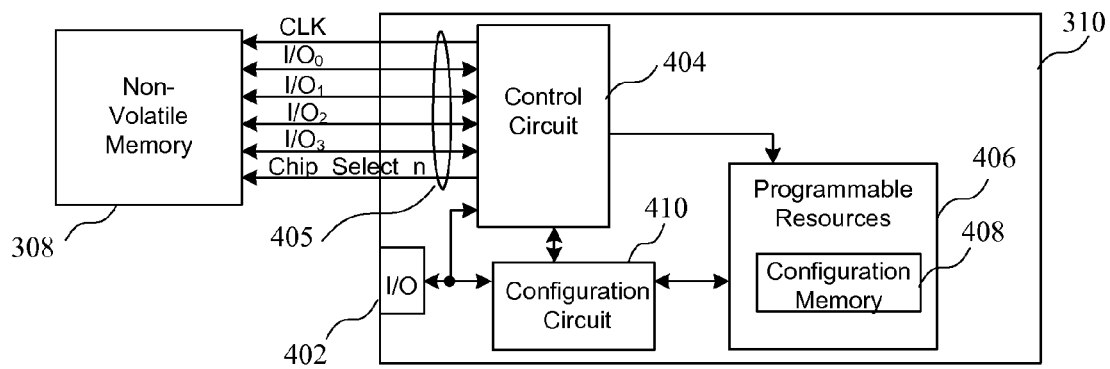
FIG. 4 is a block diagram of a system having elements for configuring programmable resources of an integrated circuit according to an embodiment.

Turning now to FIG. 4, a block diagram of a system having elements for configuring programmable resources of an integrated circuit according to an embodiment is shown. The system of FIG. 4 is implemented having the non-volatile memory 308 and the device 310, which could be a master device in a master-slave arrangement with the non-volatile memory 308 as a slave device. The device 310 comprises an input/output (I/O) port 402 coupled to a control circuit 404. The control circuit 404 has an interface which receives control, address and data signals by way of signal lines 405, and is coupled to programmable resources 406. The programmable resources 406 include configuration memory elements 408 which are configurable by a user of the circuit to implement a circuit design of the user's choice. The programmable resources 406 may include programmable logic elements or other programmable elements, such as the programmable elements described in reference to FIGS. 1 and 2. The device 310 may also comprise a configuration circuit 410 which may be implemented to load the configuration data into the configuration memory elements.

The circuits implemented in the programmable resources 406 may be implemented according to configuration bitstream downloaded to the integrated circuit 310. Generally, configuration memory 408 includes memory cells for configuring the programmable resources 406 based upon configuration bits of the configuration bitstream stored in the non-volatile memory 308. Although a single block of programmable resources 406 and configuration memory 408 is shown, a given integrated circuit may include a plurality of blocks having programmable resources controlled by configuration memory.

Figure 5:
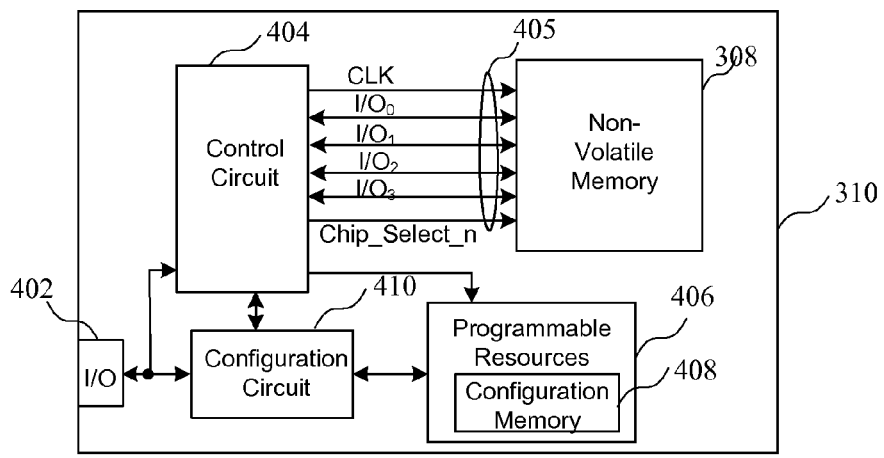
FIG. 5 is a block diagram of an integrated circuit enabling the transfer of data according to an embodiment.

The configuration circuit 410 may be implemented, as a part of or separate from the control circuit 404, to load the configuration data into the configuration memory 408. The configuration data may be loaded directly by the configuration circuit 410 by way of the I/O port 402, or by way of the control circuit 404 and the memory 308 as will be described in more detail below. The circuit of FIG. 4 may be any device having programmable resources 406, such as a programmable logic device as described below, or an application-specific integrated circuit (ASIC) having a portion of circuits which is programmable. According to the embodiment of FIG. 5, the non-volatile memory 308 is a part of the integrated circuit device 310.

Figure 6:
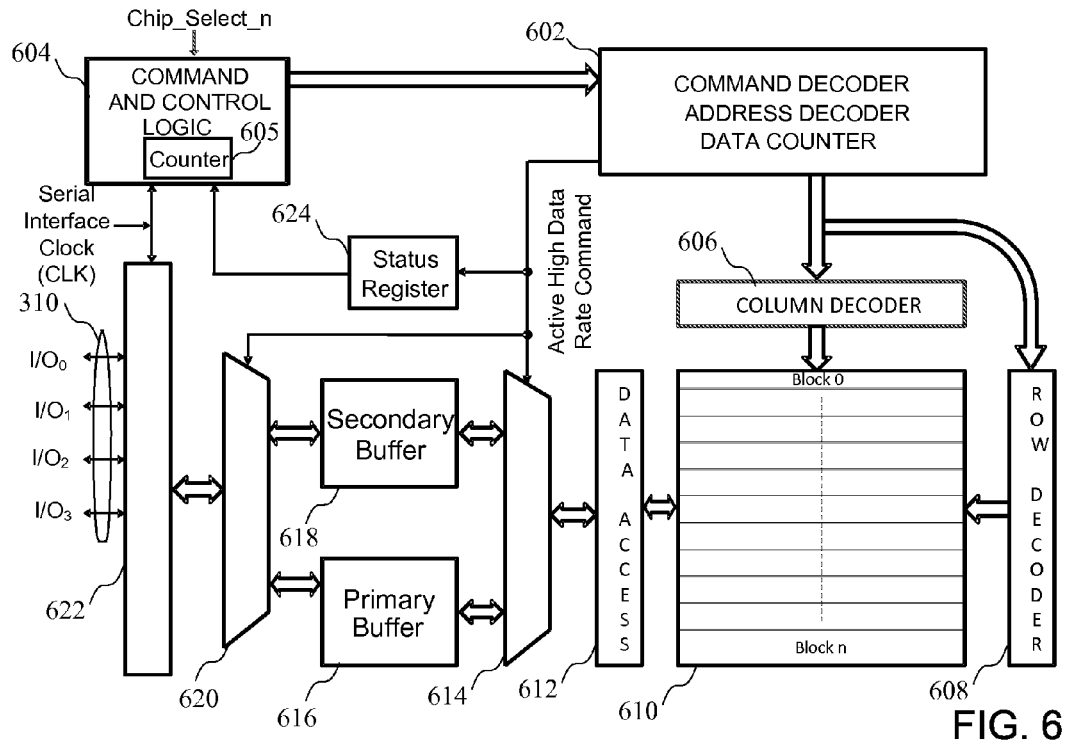
FIG. 6 is a block diagram of a non-volatile memory enabling the transfer of data according to an embodiment.

Turning now to FIG. 6, a block diagram of a non-volatile memory enabling the transfer of data according to an embodiment is shown. The circuit of FIG. 6 may be implemented entirely in the non-volatile memory 308, or some of the elements may be implemented in the non-volatile memory 308 while others may be implemented in the integrated circuit 310. The non-volatile memory of FIG. 6 comprises a decoder circuit 602, which may have a command decoder, an address decoder and a data counter, as will be described in more detail below. The decoder circuit 602 is coupled to receive signals from a command and control logic circuit 604 having a counter 605. The decoder circuit 602 is coupled to a column decoder 606 and a row decoder 608 associated with a non-volatile memory array 610. A data access circuit 612 enables routing data to or from the non-volatile memory array 610 by way of a selection circuit 614.

As will be described in more detail below, a primary buffer 616 enables access to the non-volatile memory array in a first mode, which may be a Standard mode, Dual mode or Quad mode, for example, where data is latched on either of a rising edge or a falling edge of a clock signal, and a secondary buffer 618 enables access to the non-volatile memory array in a second mode, which may be a high data rate mode where data is latched on both the rising edge and the falling edge of a clock signal, for example. Accordingly, the primary buffer 616 may be configured to latch data only on the rising or falling edge of the serial interface clock, while the secondary buffer 618 may be configured to latch data on both the rising and falling edges of the serial interface clock. A selection circuit 620 enables routing data to or from the first and second buffers, and an interface circuit 622 which routes signals using a serial interface clock (CLK) signal. As will be described in more detail below, a status register 624 stores one or more status indicators associated with a data transfer, such as a status indicating a data rate mode of the data transfer, or memory status bit indicating whether the non-volatile memory array 610 is available to send or receive data.

In addition to new circuit elements necessary to implement the non-volatile memory 308 according to various embodiments, additional instructions are provided to enable high data rate transfers. For example, a "High Data Rate Read" command, a "High Data Rate Write" command, a "High Data Rate Enable" command, and a "High Data Rate Disable" command are introduced in the instruction set, where a faster serial interface clock is used for the new instructions. The decoder circuit 602 is configured to support the new instructions. According to one embodiment, the minimum operating serial interface clock for the new "High Data Rate Read" and a "High Data Rate Write" commands is approximately 100 MHz (depending upon the integrated circuit being implemented), compared to 80 MHz for a conventional SPI protocol command in a conventional memory device. As will be described in more detail below, by implementing the new instructions with a faster clock, the data will be transferred at a faster rate.

When implementing High Data Rate Read commands, an entire page is read into the buffer circuit 618, where reading of the page is performed on both the rising and falling edges of the serial peripheral clock edge, as will be described in more detail in relation of FIG. 10. The reading of the page and preparing the data bits for transmission on each serial interface clock edge by storing the page in the buffer circuit 618 preferably should be completed in an idle period of 8 clock cycles of the serial interface clock. The 8 clock cycle period corresponds to the time required for the command and address bits to be transferred from the non-volatile memory array 610 to the buffer circuit 618. The master device can control the data transfer by stopping the serial interface clock while the Chip Select signal is still asserted.

Figure 7:
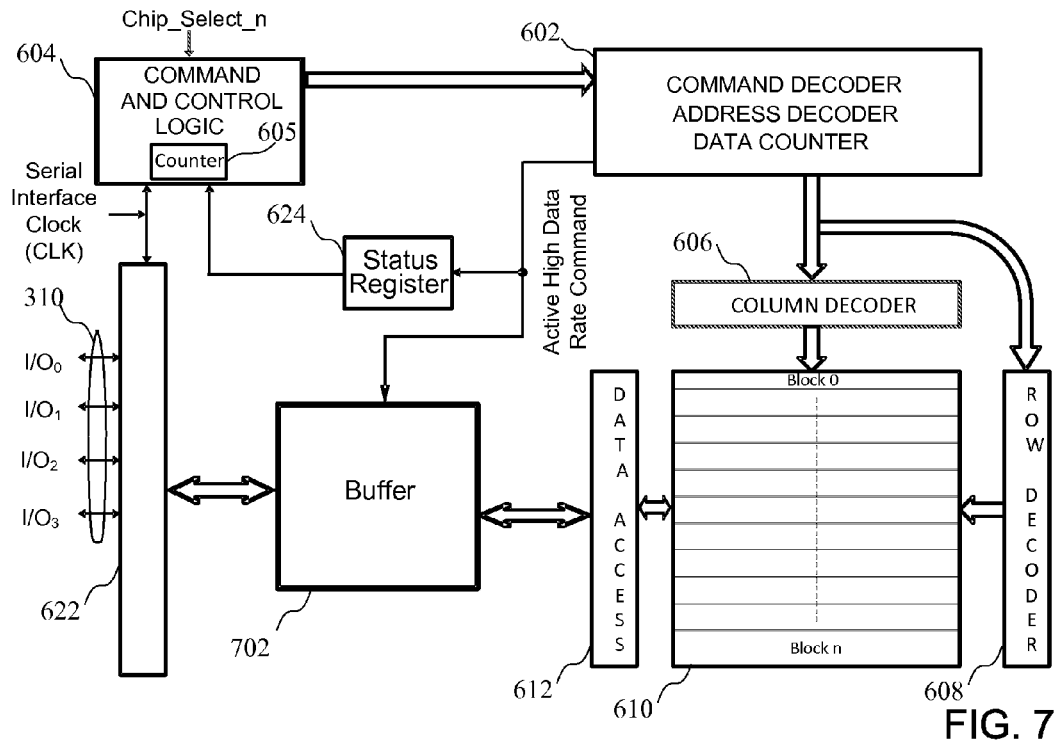
FIG. 7 is a block diagram of a non-volatile memory enabling the transfer of data according to an alternate embodiment.

With the reception of the High Data Rate Write command, the data bits from the master device are stored in the secondary buffer 618, which may comprise a local page-sized buffer. The counter 605 of the command and control logic 604 will track the number of bits received when the non-volatile memory is in active mode. Once the data bits are received, the device should take some predetermined period of time, such as approximately 8 clock cyles, to store the data at the addressed location in the non-volatile memory. The Chip Select (Chip_Select_n) signal is de-asserted, and it is again asserted when the master device initializes the next transfer. According to the embodiment of FIG. 7, a single buffer 702 may be used, where the buffer 702 will be controlled to latch data either on one of the rising or falling edges of the clock signal, or both the rising and falling edges of the clock signal. This configuration of the buffer 702 could be in response to an active High Data Rate Mode signal, for example.

In addition to the increased clock rate, other improvements are made to enable the operation of the non-volatile memory. While conventional Flash memory designs require that critical timing constraints are met, and the clock-to-data output delay from the memory may be almost 8 ns and more, it is very difficult for the master device or the slave device to operate correctly at 100 MHz with that much delay. To operate a non-volatile memory at 100 MHz as set forth below, the buffer should be able to transmit the data within a 6 ns time clock-to-data output delay period.

Figure 8:
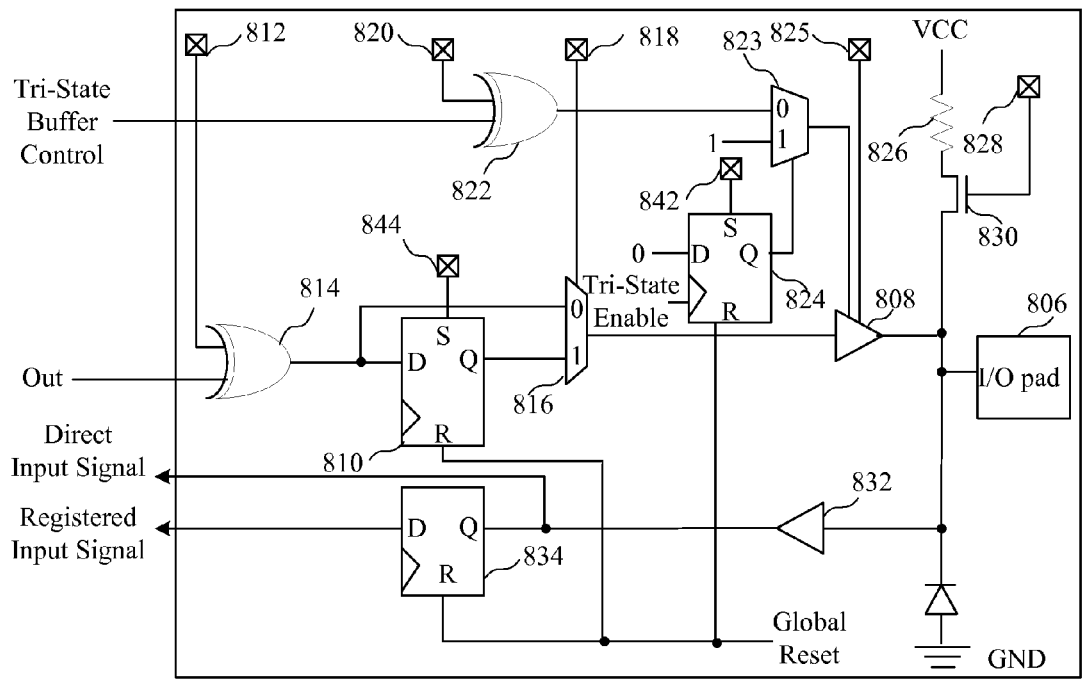
FIG. 8 is a block diagram of an input/output block of an integrated circuit device according to an embodiment.

In order to further improve the timing of the data transfers (in the embodiment of FIG. 4 where the non-volatile memory 308 is separate from the integrated circuit device 310 for example), registers are provided in the IOB's of the integrated circuit device to reduce the internal wire line delay. That is, the path from the register to the I/O pad, out of the memory, and then through a circuit board trace will provide a delay to the master device, and may take a significant amount of time. If the registers are provided inside the device beyond the IOBs, then the wire delay will be increased. These wire delays can add to the timing delays in the critical paths. To reduce this critical path at least by few picoseconds, it is recommended that the registers be placed in IOB's as shown in FIG. 8 described in more detail below. Registers have a set-up time, a hold time, and a "clock-to-q" delay. The clock-to-q delay is the time taken by the register circuit to update the output when the set-up and hold-time conditions are matched. Also, from the output of the register until the connection of the IOB, there are some routing delays associated with the register. Accordingly, once the data is stored in the register, it should take a minimum time to be presented on the IOB pad from where it will leave the device and be routed on the board trace toward a destination.

The operation speed of the non-volatile memory is dependent on the serial interface clock speed as well as the commands used. Certain commands are low speed commands and cannot go beyond a certain frequency. For example, some commands are processed at 50 MHz (or up to 80 MHz based upon the design and the manufacturer of the non-volatile memory), while some high speed commands can operate at over 100 Mhz. As the High Data Rate Read and High Data Rate Write commands are considered high speed commands, the clock rate of the serial interface clock should be increased while performing those commands. The high speed commands will be operated on the faster serial interface clock only after the master device sets a High Data Rate Mode Enable command using the standard clock speed. The High Data Rate Mode Enable and High Data Rate Mode Disable commands are performed as a standard serial interface command at the standard clock speed, while the actual High Data Rate Read and High Data Rate Write commands are performed at high data rate clock speed to realize the advantage of real dual clocking mechanism. Once the High Data Rate Mode Enable command is executed, then a High Data Rate Transfer status bit will be set in a status register. This bit will be reset when the high data rate mode is disabled, such as by executing the High Data Rate Mode Disable command.

Turning now to FIG. 8, a block diagram of an input/output block according to an embodiment is shown. The input/output block of FIG. 8 may be implemented in an IOB 104 of FIG. 1, for example. The input/output block includes an I/O pad 806 for receiving an input signal or generating an output signal. The input/output block also includes a tri-state output driver 808 that may be driven directly or by a registered value in a register 810. The polarities of both the output data and the tri-state control signal may be determined by configuration bits. In particular, an output data bit (Out) and an output invert control bit 812 are coupled to an exclusive OR (XOR) gate 814. The Out signal is coupled to the input/output block from the programmable resources or other circuits of the programmable integrated circuit. The output of the XOR gate 814 is coupled to the input of the register 810 or directly to a multiplexer 816. An output select control bit 818 is coupled to control the multiplexer 816 to enable the multiplexer to select either the output of the register 810 or the output of the XOR gate 814. The output may also be tri-stated. In order to enable the tri-stating of the output driver 808, a tri-state buffer control signal and a tri-state invert bit 820 are coupled to an XOR gate 822, the output of which is coupled by way of a multiplexer 823 to control the output driver 808. In particular, the output of the XOR gate 822 is coupled to a first input of the multiplexer 823 which also receives a logical "1" at a second input. The multiplexer 823 is controlled by a register 824 in response to a tri-state enable signal coupled to a clock input of the register 824. Each output buffer may also be configured to have either a fast or a slow slew rate according to a slew rate bit 825.

Additionally, the IOB block may be configured as a latch. When an IOB block is used exclusively as an input, an optional pull-up resistor 826 may be selected by way of a passive pull up bit 828 and coupled to the gate of a transistor 830. The resistor 826 is decoupled when the I/O block is configured as an output or as a bidirectional pin. The I/O pad 806 is also coupled to an input driver 832, the output of which is coupled to a register 834. Accordingly, a direct input signal or a registered input signal may be generated and coupled to programmable resources of the integrated circuit. The values of output invert control bit 812, output select control bit 818, tri-state invert bit 820, slew rate bit 825, and passive pull up bit 828 may be stored in configuration memory elements which are set by configuration bits of a configuration bitstream, while the tri-state buffer control signal may be generated by the programmable resources or other circuits of the programmable integrated circuit.

Figure 9:
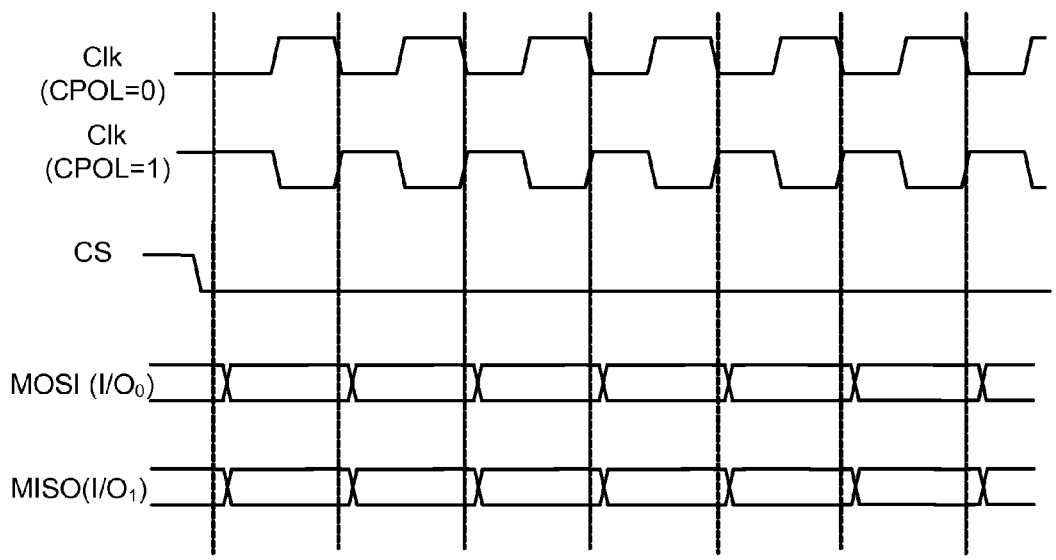
FIG. 9 is a timing diagram showing the transfer of data according to an embodiment.

According to various embodiments, data may be transmitted in one of the various modes. The timing diagram of FIG. 9 shows the transfer of data. As shown in FIG. 9, a clock signal, which may be for example the serial interface clock which is shown for both a CPOL (clock polarity) value of 0 for latching of the rising edge of the clock signal and a CPOL value of 1 for latching on the falling edge of the clock signal, enables uni-directional data to be transmitted using a dedicated MOSI ($I/O_0$) line, and a dedicated MISO ($I/O_1$) line. For example, signals (such as a command, an address or data) may be transmitted in a first mode from a master device (such as a programmable logic device) to a slave device (such as a non-volatile memory) on the MOSI ($I/O_0$) line. Return data may be transmitted from the slave device to the master device on the MISO ($I/O_1$) line.

Accordingly, when the master device writes data into the slave device, it is assumed that the master device has asserted the CS line to slave device. The master device will then transfer the data on single serial interface clock edge on the MOSI ($I/O_0$) line. While the slave device will transfer the invalid data using same serial interface clock edge on the MISO ($I/O_1$) line which is ignored by the master device. The CS line is held high by the master device, until it wants to transmit the data, after which the CS is asserted to an active low state.

Similarly, while the master device reads data from the slave device, it is assumed that the master device has asserted the CS line to the slave device. The master device sends the command, address and invalid data (which is ignored by the memory). The number of data bits to be read is equal to the number of invalid data bits sent by the master device. The slave device then sends the required data in return after decoding command and address bits. The active-low CS line is held high by the master device, until it wants to receive the data, after which the CS line is asserted (i.e. placed in the active low state). According to the data transfer mode of FIG. 9, when data has to be transmitted from the master device to the slave device in response to a write command, the MISO ($I/O_1$) line is ignored by the master device. When data has to be transmitted from slave device to the master device in response to a read command, the MOSI ($I/O_0$) line is not utilized.

By transferring data only on a single data line (i.e. one of the MOSI or the MISO lines), the data transfer interface will be under-utilized, leading to less bandwidth utilization. According to an alternate mode of transferring data as shown in FIG. 10, data may be transferred from a first device (either the master or slave device) to a second device (the other of the master or slave device) using two signal lines designated $I/O_0$ and $I/O_1$. Unlike the data transfer mode of FIG. 9 where signals, including address, control and data signals, are only transferred in one direction on a given line, signals may be transferred in either direction on the $I/O_0$ and $I/O_i$ lines. More particularly, data may be transferred on both lines in the same direction (i.e. from a master device to a slave device or from a slave device to a master device) at the same time. This mode is called the dual mode of operation.

Figure 10:
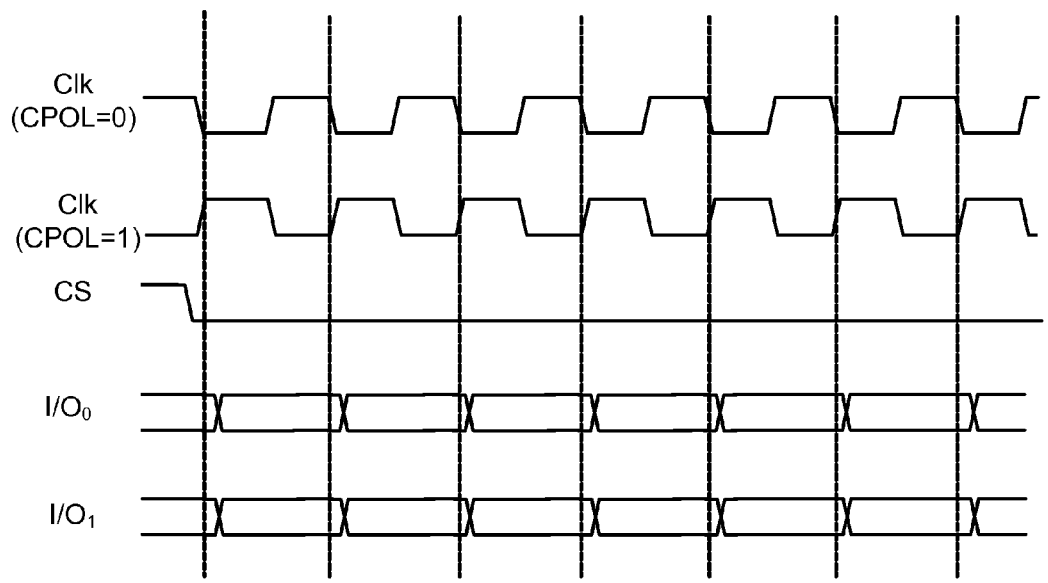
FIG. 10 is a timing diagram showing the transfer of data from a first element to a second element using two data paths according to an embodiment.

In the dual mode of transferring data of FIG. 10, the command and the address signals are transmitted on the $I/O_0$ line in a conventional format at a rate of 1 bit per 1 serial interface clock cycle. However, the data is transmitted on both the $I/O_o$ and $I/O_i$ lines. In this mode, the slave device is always in an acceptance mode for the data on $I/O_0$ and $I/O_i$ lines. According to an alternate embodiment, commands as well as the address can also be transmitted on the $I/O_0$ and $I/O_i$ lines, depending upon the type of memory and the mode in which it operates. However, the dual mode of FIG. 10 still uses a single edge (i.e. either the rising or falling edge) of serial interface clock to latch the data. Even though the arrangement of FIG. 10 improves the data transfer rate, the data transfer rate could be further increased.

Figure 11:
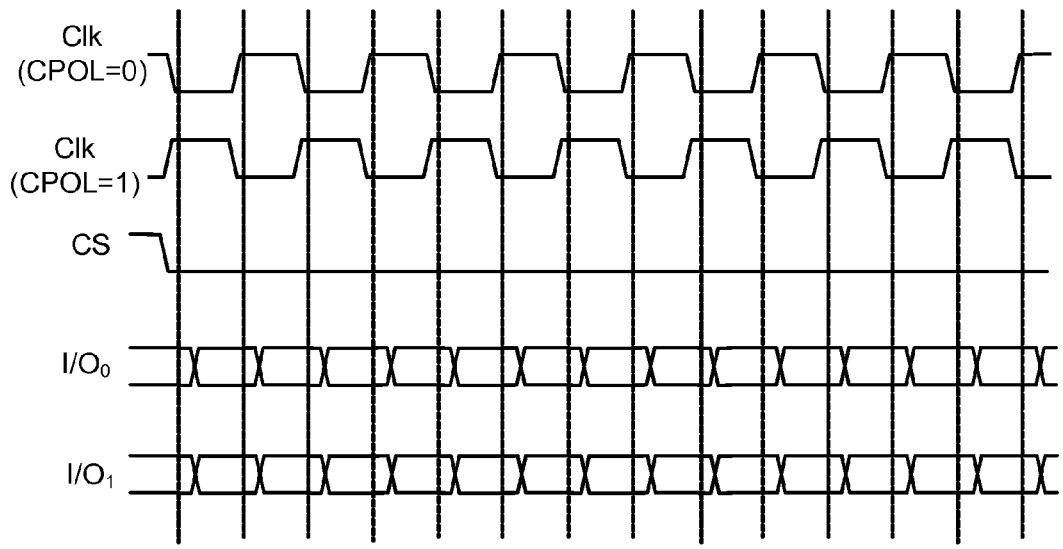
FIG. 11 is a timing diagram showing the transfer of data from a first element to a second element using two data paths on both the rising and falling edges of a clock signal according to an embodiment.
Figure 12:
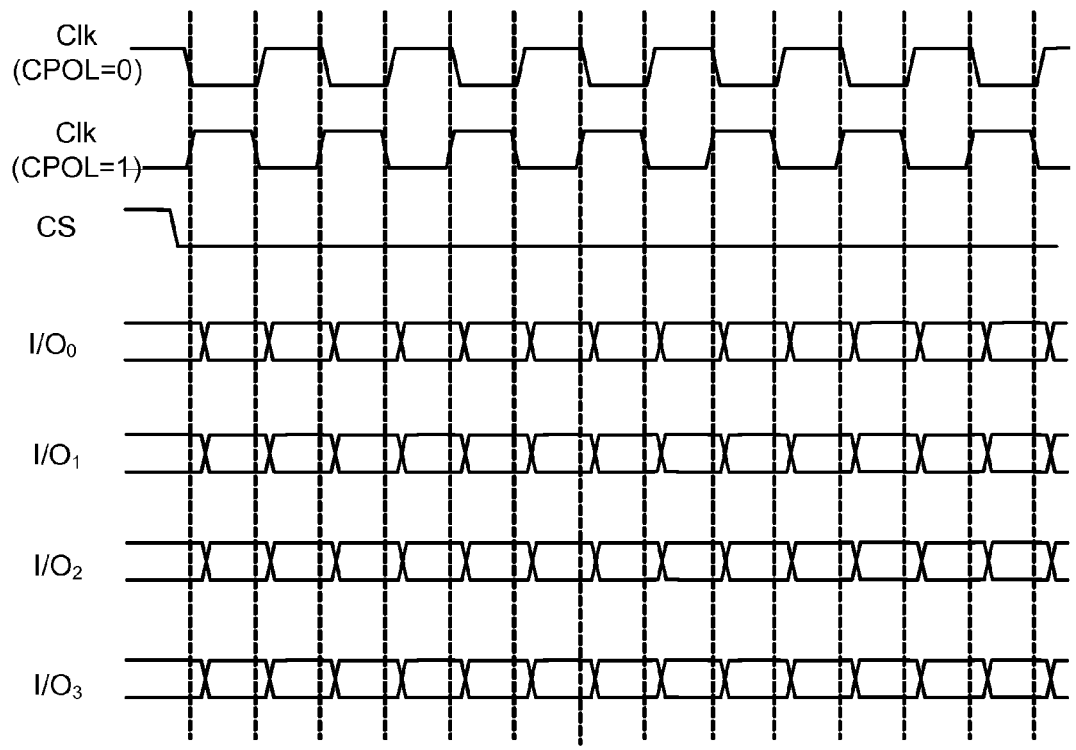
FIG. 12 is a timing diagram showing the transfer of data from a first element to a second element using four data paths on both the rising and falling edges according to an embodiment.

According to a further mode of data transfer shown in the embodiment of FIG. 11, data is transferred from a first device (i.e. either the master device or slave device depending upon whether a write or read is performed) to a second device (i.e. the other of the slave or master device) using two signal lines, where the signals are latched on both the rising and falling edge of a clock signal. By transferring signals using the high data rate mode of FIG. 11, signals are not only transferred on both signal lines, but is transferred at a double data rate by latching signals on both the rising and falling edges of the clock signal. The high data rate mode of transferring data of FIG. 11 may be further increased by using four I/O lines, designated $I/O_0$ to $I/O_3$ as shown in FIG. 12. According to one embodiment, based upon the type of memory and the data transfer mode, the command and address can also be transferred on all available data lines in a High Data Rate Transfer mode.

The modes of transferring data of FIGS. 11 and 12 improve the data transmission, bandwidth and boot up time for a device receiving data. The data transfer modes of FIGS. 11 and 12, as set forth in more detail below, enable significantly improving the data transfer rate with existing interface capability. According to various embodiments, memory devices support different types of commands which may be categorized into standard data rate mode commands and high data rate mode commands, for example. The standard data rate mode commands generally operate at lower clock rate, while the high data rate mode commands operate at a higher clock rate. By way of example, a data transmission speed can be improved to approximately 100 Mhz (from current 80 Mhz for a conventional SPI protocol command) based upon high data rate mode commands. The bandwidth of data transmission may be 800 Mbits/sec such as during execution of high data rate mode commands. The circuits and methods enabling high data rate transfers find particular application in devices having programmable resources, wherein configuration bits are transferred from a non-volatile memory to a programmable device during an initial configuration or a partial reconfiguration. The boot time for device such as an FPGA from a Flash memory can be reduced in half compared to conventional solutions. Further, the speed of configuration of external Flash memory using the high data rate transfer mode can be more than double the speed of conventional methods.

Figure 13:
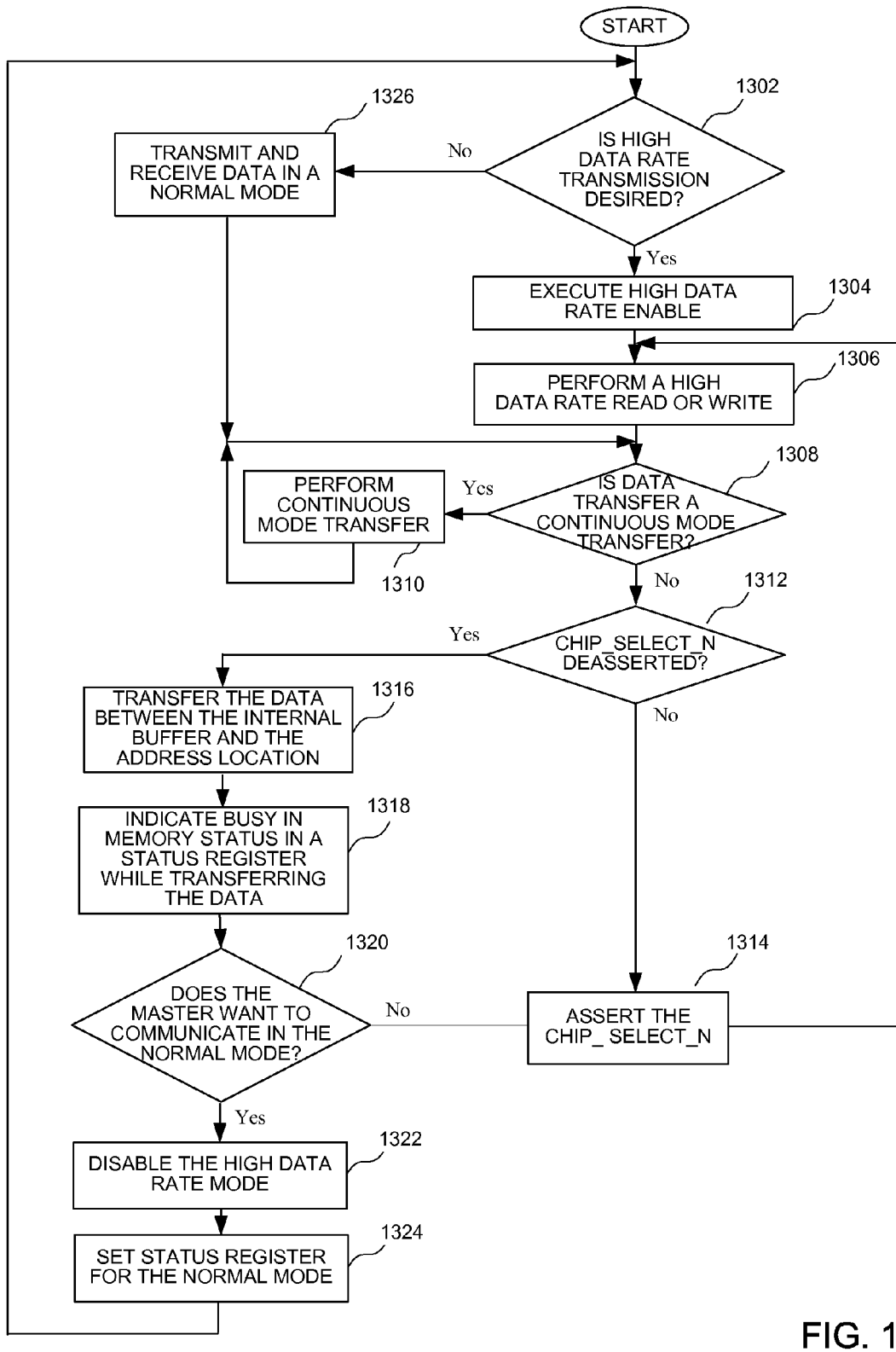
FIG. 13 is a flow chart showing a method of transferring data by an integrated circuit according to an embodiment.

Turning now to FIG. 13, a flow chart shows a method of transferring data by an integrated circuit. In particular, it is determined whether a high data rate mode of transmission is desired at a step 1302. If so, a high data rate enable operation is executed at a step 1304, after which a high data rate read or write is performed at a step 1306. Additional details related to executing a high data rate enable operation are provided in FIG. 14, while additional details related to a high data rate read or write are provided in FIG. 15. It is also determined whether data is to be transferred in a continuous data transfer mode as a step 1308. If so, the data transfer is performed in a continuous transfer mode at a step 1310, which will be described in more detail in reference to FIG. 16.

If not, it is then determined whether a Chip_Select_n signal for the memory is deasserted at a step 1312. If the Chip_Select_n signal is not deasserted, then in step 1314, the Chip_Select_n signal is asserted and the high performance data transfer is again carried out. Otherwise, the control circuit will complete the last transfer of the data between the internal buffer and the address location at a step 1316. The control circuit will then provide a busy indicator in a memory status location of a status register while transfering the data at a step 1318. It is then determined whether the master device wants to communicate in the normal mode at a step 1320. If so, the high data rate mode is disabled at a step 1322, and the status register is set for a normal mode at a step 1324. Otherwise, if the master device does not want to communicate in the normal mode, the in step 1314, the Chip_Select_n signal is asserted and the high performance data transfer is again carried out. The method of FIG. 13, as well as the methods of FIGS. 14-16 set forth below, could be implemented using any of the circuits of FIGS. 1-12 as described, or any other suitable circuits.

Figure 14:
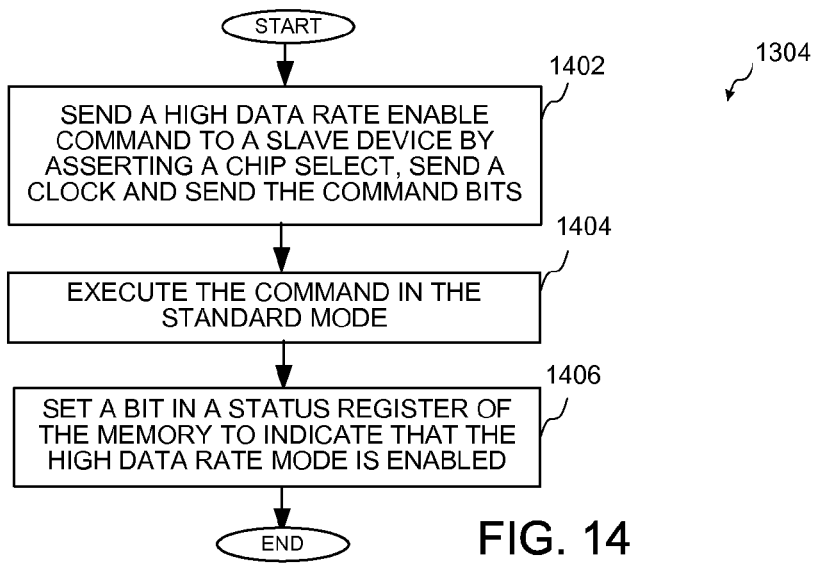
FIG. 14 is a flow chart showing a method of executing a high data rate enable according to an embodiment.

Before the "High Data Rate Read" or "High Data Rate Write" commands are initiated, a user needs to execute certain commands to put the circuit in a condition for high data rate data transactions. Therefore, a "High Data Rate Mode Enable" command is executed. The flow chart of FIG. 14 shows a method of executing a High Data Rate Mode Enable command. In particular, a High Data Rate Mode Enable command is sent to a slave device by asserting a Chip Select signal, sending a serial interface clock signal and sending the command bits at a step 1402. The command to enable a high data rate data transfer is executed using the serial interface clock in the standard clock speed at a step 1404. A bit in a status register of the memory is set to indicate the high data rate mode is enabled at a step 1406. For example, a default setting for this bit may be a '0' to indicate that the high data rate is off. As set forth above in reference to FIG. 6, the non-volatile memory device will have a status register 624 for storing the state of the data transfer mode.

The High Data Rate Mode Enable command will be transferred on the I/O$_0$ line serially using the standard data rate clock speed from the serial interface clock. The next command would be either a High Data Rate Read or a High Data Rate Wirtie command. An address, such as a 24 bit or 32 bit address is then sent using the standard data rate clock speed on D0 line. After the address is sent, the memory will need additional dummy clock cycles, such as another 8 serial interface clock cycles as dummy clock cycles. During this dummy cycle period, the dual edge buffer 618 (in the embodiment of FIG. 6) is activated. According to the embodiment of FIG. 7, the buffer 702 will be controlled to latch data on both the rising and falling edges during the high data rate read or write. The address decoding logic will decode the address and copy a block of data into the newly enabled dual edge buffer. The block of data may be a page (i.e. 256 bytes) of data from the decoded page.

After the 8 dummy clock pulses, the internal dual edge buffer is ready to respond with the data in case of High Data Rate Read command or to receive the data in case of High Data Rate Write command. The buffer 618 and buffer 702 are capable of sending the data or registering the data on both the rising and falling edge of serial interface clock. Depending upon the architecture, the minimum operating serial interface clock in the high data rate mode may be 100 MHz, for example. Once the master device transfers the page of data to the slave device (i.e. indirectly to the buffer), the master device can de-assert the Chip Select signal or can prepare new data. If the master device de-asserts the Chip Select signal, the internal logic to the memory will copy the data from the buffer to the respective addressed location in a write operation.

During the time taken to write the data back to the memory location (which may be approximately 8 serial interface clock cycles), a memory status in the status register would indicate a "busy" signal. The memory would be busy during a read while loading the next page data into the internal dual edge buffer. The memory would also be busy during a write while storing the newly loaded data from buffer to the internal memory. If master device chooses another page of data to be written (by de-asserting and asserting the Chip_Select_n signal again), then it has to first read the status register 624 and should wait till the "busy" status in the status register is reset by the memory. The resetting of "busy" bit indicates that the memory is ready to accept the new data or is ready for another high data rate read transaction. The master device can then send another page of data which will be stored in the next consecutive page location. The master device can skip a reading of the status register before writing or reading the next page of data from a next consecutive address. While doing this the master device needs to wait for at least 8 serial interface clock cycles. These 8 cycles are high speed operation clock cycles which will consume 80 ns idle time. Based upon the technology used for this implementation (for storing the dual edge buffer into memory at addressed location—while write and getting the data from addressed page into the dual edge buffer to support the read transaction) this time can be further reduced.

It is important to note that when the master device has not de-asserted the Chip Select signal, the memory assumes that it needs to write (or read data from) from next page address. This arrangement is helpful when the master device wants to read the compete memory or writes to a number of pages. However, it would be necessary in between two consecutive writes or reads to read the status register to determine if memory is busy. During the high speed data transfer, if the master decides to transfer data in continuous mode, then in between two consecutive transactions (of page read or write)—when the chip select is not de-asserted—the master should provide an idle time of 8 high speed clock cycles, where there is no transaction from master happens. This time is equal to 80 ns (or less based upon the type of technology used). If Master wants to start the next high speed transaction immediately after the first high data speed transfer is over (by momentarily de-asserting the chip Select and again re-asserting it back), then in this case, the master needs to read the status register for "Busy" bit status. If the busy bit is reset (i.e. 0) then master can de-assert the Chip_Select_n and again re-assert to start the next high speed transaction. If this "Busy" bit is still set, then master again needs to read the status register.

If the master device wants to communicate with the memory in a standard mode (i.e. not in high data rate transfer mode), the "High Data Rate Mode Disable" command will be executed. This "High Data Rate Mode Disable" command should be sent on the Standard mode format (i.e. on I/O0 line, while the CS signal is asserted and the serial interface clocks are sent). Once this command is executed, a "High Data Rate Mode" bit status in the status register shows '0' indicating that the device is not in a high data rate mode. In between these transactions, the master device may need to de-assert the Chip Select signal at least once. Now the master device can execute other commands like Standard mode, Dual mode or Quad mode commands in standard format, where the data bits are exchanged only on a single edge of the SPI clock.

Figure 15:
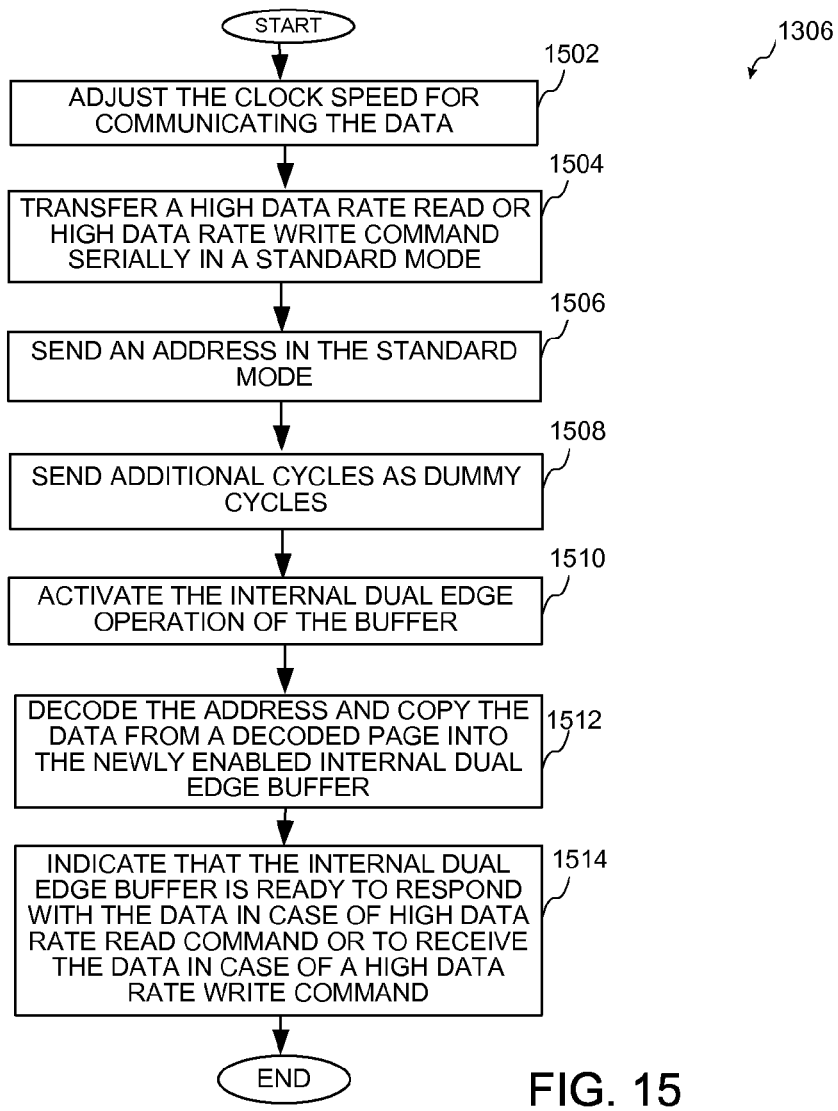
FIG. 15 is a flow chart showing a method of performing a high data rate read or write according to an embodiment.

Once the "High Data Rate Mode Enable" command is executed, a user can execute a "High Data Rate Mode Read" command or a "High Data Rate Mode Write" command. Before executing theses commands, the master device should de-assert and again assert the Chip Select signal. The de-assertion and assertion of the Chip Select signal will enable the slave device to detect the new transaction, where the first transaction is always a command and followed by an address and/or data. Turning now to FIG. 15, a flow chart shows a method of performing a high data rate mode read or a high data rate mode write according to an embodiment. In particular, the clock speed for communicating the data is adjusted if necessary at a step 1502. A High Data Rate Read or High Data Rate Write command is transferred serially using a Standard mode at a step 1504. An address is also preferably sent using the standard serial interface at a step 1506. Additional dummy data may also be sent as dummy cycles at a step 1508. A buffer, such as buffer 618 or buffer 702, is activated to latch data on both the rising and falling edges of the clock signal at a step 1510. The address is decoded and the data, such as a 256 byte page of data, is copied into the newly enabled dual edge buffer at a step 1512. A signal is provided, at a step 1514, to indicate that the internal dual edge buffer is ready to respond with the data in the event of a High Data Rate Read command, or receive the data in the event of a High Data Rate Write command.

Each high data rate transfer is of 1 memory sized page, and the CS can be de-asserted after every page transfer in order to inform the slave device of the completion of one transfer so that it can do housekeeping functions, such as loading the data into the proper page in case of write, updating the status register bits if required, reducing the operating current, etc. In this case for the next transaction again the command, address and new data has to be sent by the master device. The high data rate mode commands can be further sub-categorized into normal high data rate mode commands and continuous high data rate mode commands. In normal high data rate commands, the master device should de-assert the CS signal after each transfer completion. In case of continuous mode high data rate commands, only the starting address is needed along with the High Data Rate Read command or High Data Rate write command. In between each 1 page transaction, the master device needs to wait for 8 clock cycles to allow the slave device to carry out internal transactions.

To register the high speed mode data in the master device, an approximately maximum 5 ns window will be available. The clock-to-out time on each serial interface clock edge from memory is approximately 6 ns. 1 ns would be the maximum routing delay on the board from memory to an input IOB register, such as an IOB register of an FPGA, for example. The FPGA would have a window of a maximum 3 ns, which would be sufficient enough to register the data in the FPGA, where the FPGA can have offset constraints to match the timing requirements.

Figure 16:
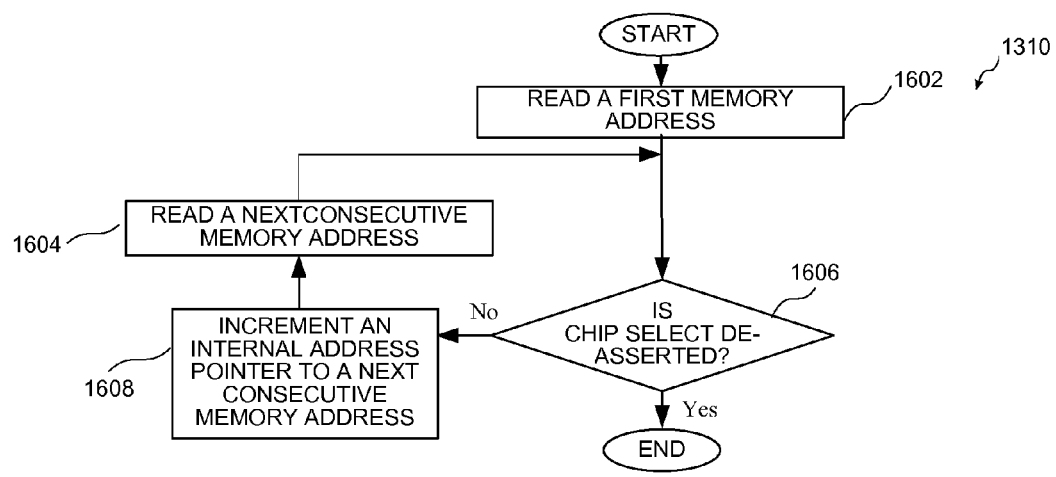
FIG. 16 is a flow chart showing a method of transferring data in a continuous mode transfer according to an embodiment.

Turning now to FIG. 16, a flow chart shows a method of transferring data in a continuous high data rate transfer mode. It is expected that the master device has enabled the slave device with the High Speed Data Enable command prior to transmitting data. A first command and memory address is read at a step 1602. It is then determined whether or not the Chip Select signal is de-asserted at a step 1606. If not, an internal address pointer, incremented in the command and control logic 1604 for example, is incremented to a next consecutive memory address at a step 1608, and the next consecutive memory address is read at the step 1604.

In case of continuous high data rate mode commands, then the memory design may be implemented with the predictive address calculation. The predictive address calculation is based upon the type of high data rate command used (i.e. a read or write command). During read, once the complete page is loaded into the data buffer, an internal address pointer can be incremented to next consecutive memory address, for example. That is, if such a high data rate command is executed, then there is no need to provide the same command and new address again, thereby reducing the internal address decoding time in a next consecutive transaction.

It can therefore be appreciated that the new and novel method of communicating data with an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

I claim:

1. A circuit for enabling the transfer of data by an integrated circuit device, the circuit comprising:
   a non-volatile memory array coupled to receive a clock signal and having a plurality of memory elements storing data;
   a buffer coupled to the non-volatile memory array; and
   a control circuit coupled to the non-volatile memory array, the control circuit enabling uni-directional transfer of data on a plurality of signal lines between the non-volatile memory array and the control circuit in a first, high data rate transfer mode and bi-directional transfer of data on the plurality of signal lines between the non-volatile memory array and the control circuit in a second mode, and enabling dual edge operation of the buffer coupled to the non-volatile memory array during the high data rate transfer of data with the non-volatile memory array;
   wherein the control circuit controls the transfer of data on the plurality of signal lines between the non-volatile memory array and the control circuit in the first mode on both the rising and falling edges of the clock signal.

2. The circuit of claim 1 further comprising a status register storing an indication of the transfer of data in one of the first mode and the second mode.

3. The circuit of claim 2 wherein the indication of the transfer of data in one of the first mode and the second mode is generated by the control circuit.

4. The circuit of claim 1 wherein a first signal line of the plurality of signal lines is adapted to transmit data from the control circuit to the non-volatile memory array and a second signal line of the plurality of signal lines is adapted to transmit data from the non-volatile memory array to the control circuit in the second mode.

5. The circuit of claim 1 wherein a first signal line of the plurality of signal lines is adapted to transmit data from the non-volatile memory array to the control circuit and a second signal line of the plurality of signal lines is adapted to transmit data from the non-volatile memory array to the control circuit in the first mode.

6. The circuit of claim 1 further comprising a buffer which may be configured to transfer data on both the rising and falling edges in the first mode and to transfer data on one of the rising or falling edges of the clock signal in the second mode.

7. The circuit of claim 1 further comprising a first buffer enabling the transfer of data from the non-volatile memory array to the configuration memory elements on a first signal line of the plurality of signal lines in a standard mode, and a second buffer enabling the transfer of data from the non-volatile memory array to the configuration memory elements on the first signal line and a second signal line of the plurality of signal lines in a high data rate mode.

8. A circuit for enabling the transfer of data by an integrated circuit device, the circuit comprising:
- a non-volatile memory array coupled to receive a clock signal and having a plurality of memory elements storing data;
- a control circuit coupled to the non-volatile memory array, the control circuit enabling uni-directional transfer of data on a plurality of signal lines between the non-volatile memory array and the control circuit in a first mode and bi-directional transfer of data on the plurality of signal lines between the non-volatile memory array and the control circuit in a second mode;
- a first buffer coupled to the non-volatile memory array, the first buffer receiving data transferred in the first mode; and
- a second buffer coupled to the non-volatile memory array, the second buffer receiving data transferred in the second mode;
- wherein the control circuit controls the transfer of data in the second mode on both the rising and falling edges of the clock signal.

9. The circuit of claim 8 further comprising a status register storing an indication of a transfer of data on one of the rising or falling edges of the clock signal or both of the rising and falling edges of the clock signal.

10. The circuit of claim 8 further comprising a status register storing a memory busy indication bit.

11. The circuit of claim 8 wherein a first signal line of the plurality of signal lines is adapted to transmit data to the non-volatile memory array and a second signal line of the plurality of signal lines is adapted to transmit data from the non-volatile memory array in the second mode.

12. The circuit of claim 11 wherein the first signal line of the plurality of signal lines is adapted to transmit data to the non-volatile memory array and the second signal line of the plurality of signal lines is adapted to transmit data to the non-volatile memory array in the first mode.

13. The circuit of claim 8 further comprising a third data line and a fourth data line, wherein data is transferred to the non-volatile memory array on each of the first through fourth data lines in a third mode.

14. A method of enabling the transfer of data by an integrated circuit device, the method comprising:
- enabling the bi-directional communication of data between a non-volatile memory array and a circuit of the integrated circuit using a plurality of signal lines;
- receiving a command to transfer data at a high data rate with the non-volatile memory array;
- receiving a clock signal for transferring the data with the non-volatile memory array;
- enabling dual edge operation of a buffer coupled to the non-volatile memory array during the high data rate transfer of data with the non-volatile memory array; and
- transferring the data on the plurality of signal lines between the non-volatile memory array and the circuit using both a rising edge and a falling edge of the clock signal.

15. The method of claim 14 further comprising setting a status register indicating that data is being transmitted at the high data rate.

16. The method of claim 14 further comprising receiving a chip select signal to transfer a page of data.

17. The method of claim 16 further comprising storing a busy indication in a status register until the page of data is transferred between a buffer and the non-volatile memory array.

18. The method of claim 17 further comprising waiting for the busy indication to be reset if the chip select signal remains asserted.

19. The method of claim 14 further comprising adjusting the clock speed when transferring the data with the non-volatile memory array during the high data rate transfer of data with the non-volatile memory array.

* * * * *